(12) United States Patent
Watanabe et al.

(10) Patent No.: US 8,378,700 B2
(45) Date of Patent: Feb. 19, 2013

(54) WAFER UNIT FOR TESTING SEMICONDUCTOR CHIPS AND TEST SYSTEM

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 193 days.

(21) Appl. No.: 12/953,362

(22) Filed: Nov. 23, 2010

(65) Prior Publication Data

US 2011/0234252 A1    Sep. 29, 2011

Related U.S. Application Data

(63) Continuation of application No. PCT/JP2008/060176, filed on Jun. 2, 2008.

(51) Int. Cl.
*G01R 31/20* (2006.01)

(52) U.S. Cl. ......... 324/754.07; 324/756.03; 324/762.01; 702/117

(58) Field of Classification Search .................. None
See application file for complete search history.

(56) References Cited

U.S. PATENT DOCUMENTS

| | | | |
|---|---|---|---|
| 6,400,173 B1 * | 6/2002 | Shimizu et al. | 324/754.07 |
| 6,452,411 B1 * | 9/2002 | Miller et al. | 324/754.07 |
| 6,762,611 B2 * | 7/2004 | Hubner et al. | 324/756.03 |
| 6,768,349 B2 * | 7/2004 | Nakagawa | 327/100 |
| 7,403,029 B2 * | 7/2008 | Chong et al. | 324/755.05 |
| 7,649,366 B2 * | 1/2010 | Henson et al. | 324/754.03 |
| 7,859,277 B2 * | 12/2010 | Mayder et al. | 324/762.06 |
| 8,006,146 B2 * | 8/2011 | Kanasugi | 714/719 |
| 2001/0047496 A1 | 11/2001 | Hidaka et al. | |
| 2008/0054917 A1 | 3/2008 | Henson et al. | |

FOREIGN PATENT DOCUMENTS

| | | |
|---|---|---|
| JP | 7-231021 A | 8/1995 |
| JP | 8-184612 A | 7/1996 |
| JP | 11-121553 A | 4/1999 |
| JP | 2001-338953 A | 12/2001 |
| JP | 2002-222839 A | 8/2002 |
| TW | 200604531 A | 2/2006 |

OTHER PUBLICATIONS

Korean Office Action dated Oct. 24, 2011, in a counterpart Korean patent application 10-2010-7026134, citing Foreign Patent documents JP H11-121553 and JP2001-338953 which have been submitted in a previous IDS.
International Search Report (ISR) issued in PCT/JP2008/060176 (parent application) mailed in Sep. 2008 for Examiner consideration, citing U.S. Patent Application Publication No. 1 and Foreign Patent document Nos. 1-4 listed above.
Written Opinion (PCT/ISA/237) issued in PCT/JP2008/060176 (parent application) mailed in Sep. 2008.
Taiwanese Office Action dated Aug. 27, 2012, in a counterpart Taiwanese patent application 098118026.

\* cited by examiner

*Primary Examiner* — Richard Isla Rodas

(57) ABSTRACT

Provided is a test wafer unit for testing a plurality of semiconductor chips formed on a semiconductor wafer, the test wafer unit including: a test wafer having a shape corresponding to a shape of the semiconductor wafer; and a plurality of test circuits formed on the test wafer, each test circuit provided to correspond to two or more of the plurality of semiconductor chips and testing the two or more semiconductor chips. The test wafer unit may include a plurality of connection terminals formed on the test wafer in one to one relation with test terminals of the plurality of semiconductor chips, where each of the plurality of connection terminals is connected to a corresponding one of the test terminals.

7 Claims, 11 Drawing Sheets

WAFER UNIT FOR TESTING SEMICONDUCTOR CHIPS AND TEST SYSTEM

BACKGROUND

1. Technical Field

The present invention relates to a test wafer unit and a test system. In particular, the present invention relates to a test wafer unit and a test system for testing a plurality of semiconductor chips formed on a semiconductor wafer.

2. Related Art

An apparatus is already known to conduct a test to a semiconductor wafer in which a plurality of semiconductor chips are formed to test pass/fail of each semiconductor chip (see Japanese Patent Application Publication No. 2002-222839 for example). Such an apparatus can have a probe card that can be collectively electrically connected to a plurality of semiconductor chips.

Generally, a probe card is formed using a printed circuit board or the like. A plurality of probe pins formed on the printed circuit board can be collectively electrically connected to the plurality of semiconductor chips.

One method of testing a semiconductor chip uses a BOST circuit. The BOST circuit can be mounted on a probe card. When a test is conducted to a semiconductor wafer, however, a multitude of BOST circuits are required, which are difficult to be implemented on the printed circuit board of the probe card.

Another method of testing a semiconductor chip uses a BIST circuit provided in a semiconductor chip. However, this method involves formation of circuits, in the semiconductor chip, not used in the actual operation, thereby reducing the region for forming the actually operating circuits in the semiconductor chip.

If a semiconductor chip is tested as mounted on a semiconductor wafer, the area on which the test circuits are mountable decreases if the mounting density of the semiconductor chips is large. This makes it occasionally difficult to mount highly advanced test circuits.

SUMMARY

Therefore, it is an object of an aspect of the innovations herein to provide a test wafer unit and a test system, which are capable of overcoming the above drawbacks accompanying the related art. The above and other objects can be achieved by combinations described in the claims. A first aspect of the innovations herein may include a test wafer unit for testing a plurality of semiconductor chips formed on a semiconductor wafer, the test wafer unit including: a test wafer having a shape corresponding to a shape of the semiconductor wafer; and a plurality of test circuits formed on the test wafer, each test circuit provided to correspond to two or more of the plurality of semiconductor chips and testing the two or more semiconductor chips.

A second aspect of the innovations may include a test system for testing a plurality of semiconductor chips formed on a semiconductor wafer, the test system including: a test wafer unit connected to the semiconductor wafer; and a control apparatus that controls the test wafer unit, where the test wafer unit includes: a test wafer having a shape corresponding to a shape of the semiconductor wafer; and a plurality of test circuits formed on the test wafer, each test circuit provided to correspond to two or more of the plurality of semiconductor chips and testing the two or more semiconductor chips.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
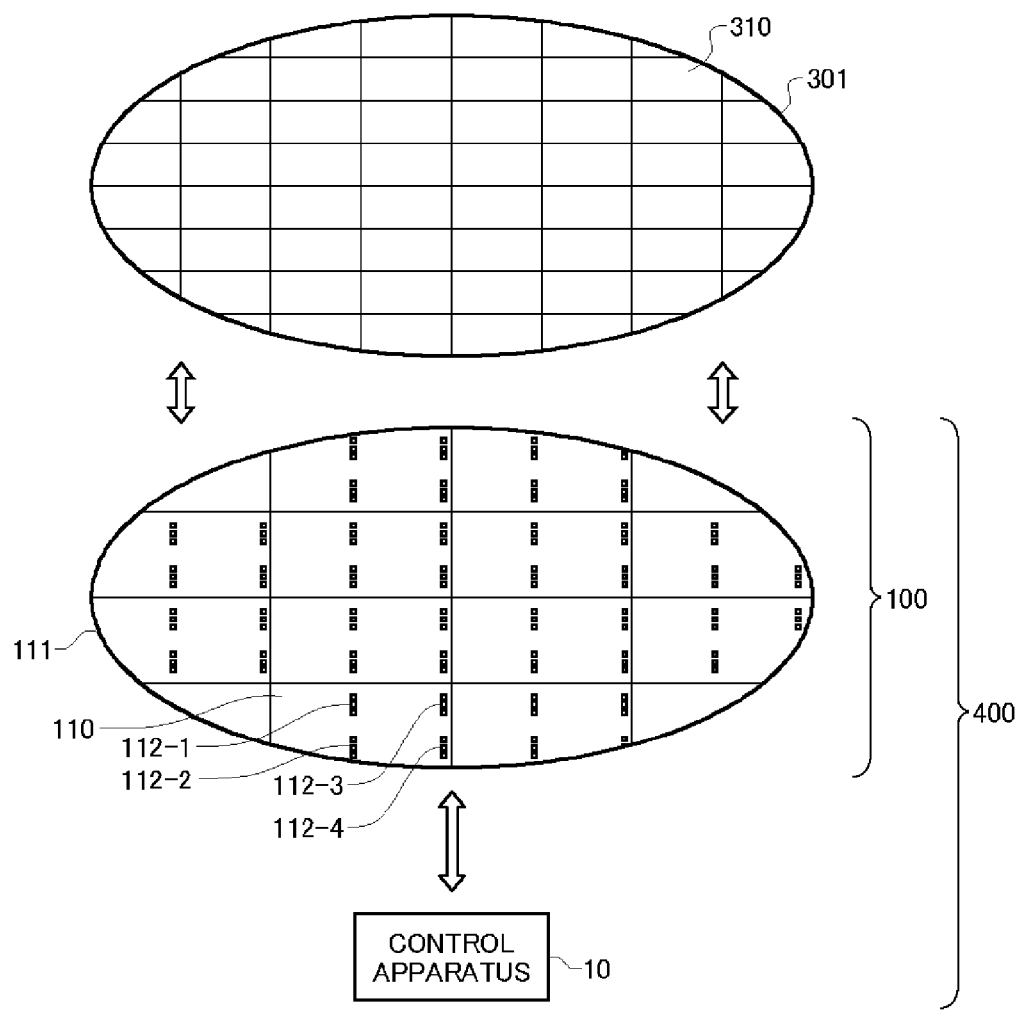
FIG. 1 shows an overview of a test system 400 for testing a plurality of semiconductor chips 310 formed on a semiconductor wafer 301.

FIG. 1 shows an overview of a test system 400 according to an embodiment. The test system 400 tests a plurality of semiconductor chips 310 formed on a semiconductor wafer 301, as devices under test. The test system 400 in the present example includes a test wafer unit 100 and a control apparatus 10. Note that FIG. 1 shows an exemplary perspective view of the semiconductor wafer 301 and the test wafer unit 100.

The semiconductor wafer 301 may be a semiconductor wafer having a disk shape. More specifically, the semiconductor wafer 301 may be made of silicon, compound semiconductor, or may be other semiconductor wafers. The semiconductor chip 310 may be formed on the semiconductor wafer 301 by a semiconductor process such as exposure. Each of the plurality of semiconductor chips 310 includes an operation circuit and an embedded memory.

The test wafer unit 100 includes a test wafer 111. The test wafer 111 is electrically connected to the semiconductor wafer 301. More specifically, the test wafer 111 is collectively electrically connected to the plurality of semiconductor chips 310 formed on the semiconductor wafer 301.

The test wafer 111 may be a semiconductor wafer made of the same semiconductor material as the semiconductor material used to make the semiconductor wafer 301. For example, the test wafer 111 may be a silicon wafer. The test wafer 111 may be made of a semiconductor material having substantially the same thermal expansion coefficient as that of the semiconductor wafer 301. The test wafer 111 may have a shape corresponding to the shape of the semiconductor wafer 301. In the present document, "a corresponding shape" or similar expressions indicates that the relevant members have the same shape as each other, or that the relevant members are shaped such that one corresponds to a part of the other.

For example, the test wafer 111 may have the same shape as that of the semiconductor wafer 301. More specifically, the test wafer 111 may be a wafer having a disk shape having substantially the same diameter as that of the semiconductor wafer 301. The test wafer 111 may have a shape that, when overlapped to the semiconductor wafer 301, corresponds to a part of the semiconductor wafer 301. When the semiconductor wafer 301 has a disk shape, the test wafer 111 may have the shape of a part of the disk (e.g., semicircular shape).

A plurality of circuit blocks 110 are formed on the test wafer 111. The plurality of circuit blocks 110 are provided to correspond to the plurality of semiconductor chips 310. In the present exemplary configuration, the plurality of circuit blocks 110 are provided so that each one corresponds to two or more semiconductor chips 310. Hereinafter, the two or more semiconductor chips 310 provided to correspond to each one of the plurality of circuit blocks 110 may be occasionally referred to as "corresponding semiconductor chips 310."

Each circuit block 110 may be provided to correspond, in position, to two or more semiconductor chips 310, when the test wafer 111 is overlapped on the semiconductor wafer 301. When the test wafer 111 is overlapped on the semiconductor wafer 301, each circuit block 110 is brought in electrical connection to the corresponding semiconductor chips 310 and tests them.

Note that the circuit blocks 110 may be provided on a rear surface of the test wafer 111, which is opposite to the surface of the test wafer 111 that faces the semiconductor wafer 301. In this case, the circuit blocks 110 may be electrically connected to the corresponding semiconductor chips 310 via through holes (via holes) formed through the test wafer 111.

For example, a plurality of connection pads 112 are formed on a wafer connection surface of the test wafer 111, so that each semiconductor chip 310 corresponds to at least one connection pad 112. For example, each one test pad of each semiconductor chip 310 may correspond to one connection pad 112. In other words, when each semiconductor chip 310 is provided with a plurality of test pads, the semiconductor chip 310 may accordingly correspond to a plurality of connection pads 112.

For example, the test wafer 111 may be provided with connection pads 112 in the same number as the test pads. Each connection pad 112 is electrically connected with a corresponding test pad of a semiconductor chip 310.

Here, a test pad may be an example of a test terminal. The connection pads 112 function as a plurality of connection terminals to be electrically connected to the test pads. In this way, the test wafer 111 is provided with a plurality of connection pads 112 provided in one to one relation with the test pads of the plurality of semiconductor chips 310, so that each connection pad 112 is electrically connected to a corresponding one of the test pads.

Note that the expression "electrical connection" and its derivatives in the present document may indicate to cause an electric signal conveyable between two members. For example, the circuit blocks 110 may be brought in electrical connection with the test pads of the semiconductor chips 310 either by direct contact or by indirect contact via another conductor. For example, between the semiconductor wafer 301 and the test wafer 111 in the test system 400, there may be a probe member such as a membrane sheet having substantially the same diameter as the diameter of these wafers. The membrane sheet has bumps for electrically connecting the circuit blocks 110 and the test pads of the semiconductor chips 310. The test system 400 may include an anisotropic conductive sheet between the membrane sheet and the test wafer 111.

The circuit blocks 110 and the test pads of the semiconductor chips 310 may be electrically connected to each other in a non-contact state such as capacitance coupling (also referred to as electrostatic coupling) or inductive coupling (magnetic coupling). A part of the transmission path between the circuit blocks 110 and the test pads of the semiconductor chips 310 may be optical transmission paths.

The circuit blocks 110 exchange signals with the corresponding semiconductor chips 310 via the connection pads 112. Each circuit block 110 supplies a test signal, being an example of a measurement signal, to the corresponding semiconductor chips 310. Each circuit block 110 receives a response signal outputted from the corresponding semiconductor chips 310 in response to the test signal. When a control apparatus 10 that controls the test wafer 111 has issued a test signal to a circuit block 110, the circuit block 110 is brought in electrical connection with the control apparatus 10 via the apparatus connection terminal formed on a apparatus connection surface that is at the backside of the wafer connection surface.

When the plurality of semiconductor chips 310 on the semiconductor wafer 301 have a same circuit configuration, the circuit blocks 110 on the test wafer 111 may also have the same circuit configuration. When the arrangement of the test pads is the same across the semiconductor chips 310, the arrangement of the connection pads 112 may also be the same across the circuit blocks 110.

Each circuit block 110 may judge pass/fail of the corresponding semiconductor chips 310 by comparing the logic pattern of the response signal with a predetermined expected value pattern. Each circuit block 110 writes the pass/fail judgment results of the corresponding semiconductor chips 310 to the embedded memories respectively of the corresponding semiconductor chips 310. Each circuit block 110 may read the pass/fail judgment results from the embedded memories respectively of the corresponding semiconductor chips 310, and supply test signals corresponding to the read pass/fail judgment results to the corresponding semiconductor chips 310.

The test wafer unit 100 in the present example writes the test result to the embedded memory of each semiconductor chip 310, which helps largely decrease the capacity of the fail memory to be formed on the circuit blocks 110. In some cases, the fail memory does not have to be provided.

Each circuit block 110 may output the test result of the embedded memory of a corresponding semiconductor chip 310 to the control apparatus 10. For example, a circuit block 110 may transmit the test result of the embedded memory of a corresponding semiconductor chip 310 to the control apparatus 10, if the test result of the embedded memory indicates "fail." A circuit block 110 may transmit, to the control apparatus 10, the test result of testing the necessary function to operate the embedded memory of a corresponding semiconductor chip 310. A circuit block 110 may write the test result of a semiconductor chip 310 stored in the embedded memory indicating "fail", to the embedded memory of a different one of the corresponding semiconductor chips 310 whose test result indicates "pass."

The test wafer 111 in the present example is made by the same semiconductor material as the material of the semiconductor wafer 301. Therefore, even when the ambient temperature has fluctuated, the electrical connection between the test wafer 111 and the semiconductor wafer 301 can be maintained favorable. This helps testing of the semiconductor wafer 301 with accuracy, even when testing the heated semiconductor wafer 301 for example.

Moreover, since the test wafer 111 is made by a semiconductor material, it becomes easy to form high-density circuit blocks 110 on the test wafer 111. For example, such high-density circuit blocks 110 can be easily formed on the test wafer 111 by a semiconductor process such as exposure. Accordingly, many circuit blocks 110 corresponding to same number of semiconductor chips 310 can be relatively easily formed on the test wafer 111.

In addition, the size of the control apparatus 10 can be reduced when the circuit blocks 110 are provided on the test wafer 111. To be more specific, the test system 400 in the present example incorporates the circuit for testing the semiconductor chips 310 in the test wafer unit 100, the control apparatus 10 can test each semiconductor chip 310 by controlling the test wafer unit 100. For example, the control apparatus 10 may only have to be equipped with a function to notify the circuit blocks 110 of the timing to start a test, a function to read a test result of a circuit block 110, a function to supply a driving power to a circuit block 110 and a semiconductor chip 310.

Figure 2:
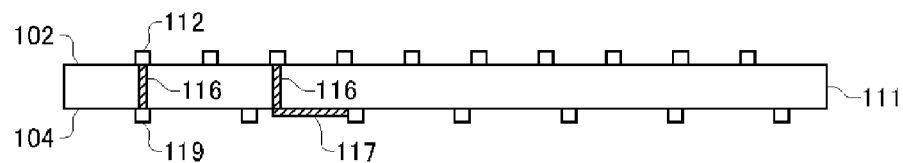
FIG. 2 explains an example of a side view of a test wafer 111.

FIG. 2 shows an example of a side view of the test wafer 111. As mentioned above, the test wafer 111 has a wafer connection surface 102 that faces the semiconductor wafer 301, and an apparatus connection surface 104 that is at the backside of the wafer connection surface 102. The plurality of connection pads 112 are formed on the wafer connection surface 102. The plurality of pads 119 are formed on the apparatus connection surface 104. The terminals of the test wafer 111 may be formed on the test wafer 111 by plating or evaporation of a conductive material.

The test wafer 111 may have the through holes 116 to electrically connect the pads 119 to the connection pads 112. Each through hole 116 is provided through the test wafer 111.

The distance between any two adjacent pads 119 may be different from the distance between any two adjacent connection pads 112. The distance between any two adjacent connection pads 112 may be the same as the distance between any two adjacent input terminals of the semiconductor chips 310, to facilitate electrical connection of the connection pads 112 to the input terminals. As shown in an example of FIG. 1, the connection pads 112 on each semiconductor chip 310 are provided with a minute distance therebetween.

On the other hand, the distance between any two adjacent pads 119 may be wider than the distance between any two adjacent connection pads 112 corresponding to a single semiconductor chip 310. For example, the pads 119 may be distributed on the apparatus connection surface 104 at a constant distance thereamong and substantially evenly. In addition, the wire 117 may be formed on the test wafer 111 to electrically connect the pads 119 to the through holes 116.

Although not shown in FIG. 2, the circuit blocks 110 may be formed on the apparatus connection surface 104 of the test wafer 111, or on the wafer connection surface 102. The circuit blocks 110 may be formed on an intermediate layer of the test wafer 111.

Figure 3:
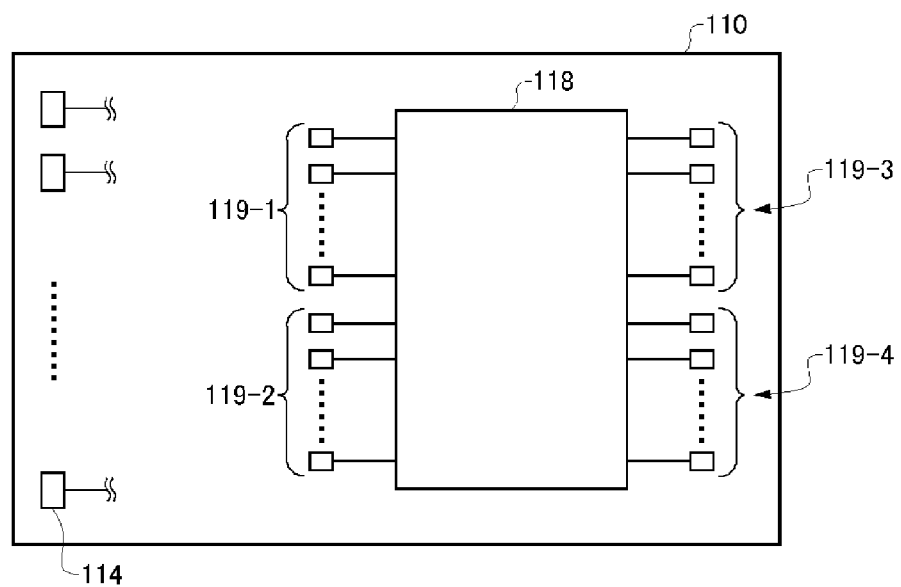
FIG. 3 shows an exemplary configuration of a circuit block 110.

FIG. 3 shows an exemplary configuration of a circuit block 110. In the present example, the circuit block 110 is formed on the apparatus connection surface 104.

Each circuit block 110 is provided with a test circuit unit 118. The circuit block 110 is provided with a plurality of pads 119 and a plurality of apparatus connection terminals 114. The plurality of pads 119 are electrically connected to the connection pads 112 formed on the wafer connection surface 102 via the through holes 116.

Each test circuit unit 118 is electrically connected to the control apparatus 10 via an apparatus connection terminal 114. Each test circuit unit 118 may be provided with a control signal, a power supply, and so on, from the control apparatus 10, via the apparatus connection terminal 114.

A test circuit unit 118 supplies a test signal to a connection pad 112 via a pad 119, to conduct a test on a corresponding semiconductor chip 310. The pads 119 are provided so that one pad 119 corresponds to one connection pad 112. Here, the connection pads 112 are provided in one to one relation with the test pads of the semiconductor chips 310. For example, the pad 119-1, the pad 119-2, the pad 119-3, and the pad 119-4 are connected to the connection pad 112-1, the connection pad 112-2, the connection pad 112-3, and the connection pad 112-4, respectively. Here, the connection pad 112-1, the connection pad 112-2, the connection pad 112-3, and the connection pad 112-4 are connected to respectively different test pads of the semiconductor chips 310.

A test circuit unit 118 may test all the corresponding semiconductor chips 310 substantially simultaneously, by supplying a test signal to the connection pads 112 connected to these semiconductor chips 310. A test circuit unit 118 may test a first part of the corresponding semiconductor chips 310 substantially simultaneously, by supplying a test signal to the connection pads 112 connected to the first part of the corresponding semiconductor chips 310.

In addition, after testing the first part of the corresponding semiconductor chips 310, the test circuit unit 118 may also test at least a part of the other semiconductor chips 310 of the corresponding semiconductor chips 310, which is other than the first part of the corresponding semiconductor chips 310, by supplying a test signal to the at least a part of the other semiconductor chips 310 of the corresponding semiconductor chips 310. Note that the first part of the corresponding semiconductor chips 310 may be a single semiconductor chip 310, or may be two or more semiconductor chips 310.

Figure 4:
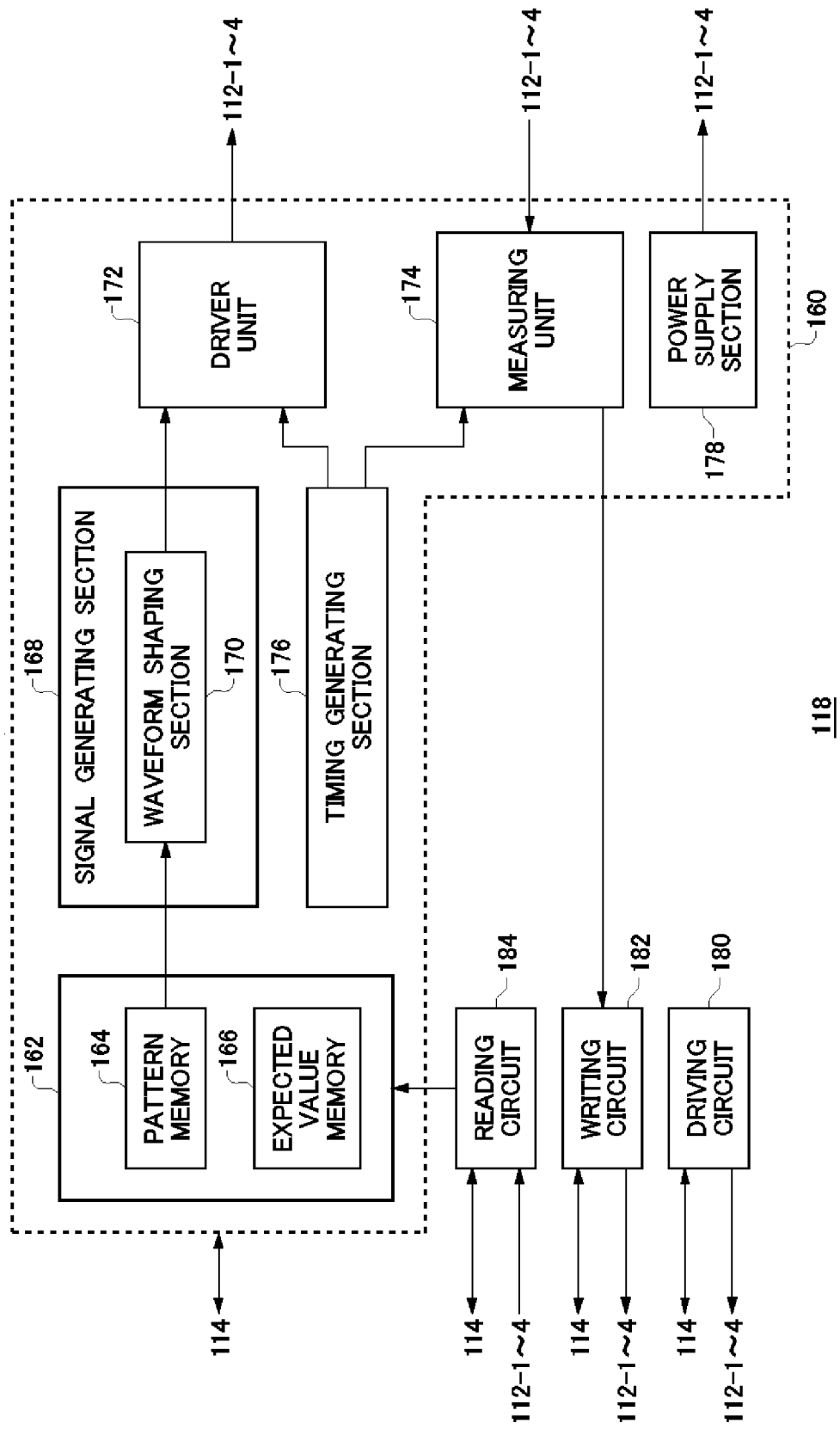
FIG. 4 is a block diagram showing an exemplary functional configuration of a test circuit unit 118.

As explained above, the circuit blocks 110 are formed on the test wafer 111 made of a semiconductor, and so the test circuit units 118 having a semiconductor device can be formed with high density. Moreover, each circuit block 110 is designed to test a plurality of corresponding semiconductor chips 310, thereby allowing a sufficient space for mounting the test circuit units 118. This facilitates implementation of a large-size circuit by means of the test circuit units 118, and further reduction of the size of the control apparatus 10, FIG. 4 is a block diagram showing an exemplary functional configuration of a test circuit unit 118. A circuit block 110 includes a test circuit 160, a driving circuit 180, a writing circuit 182, and a reading circuit 184. The test circuit 160 includes a pattern generating section 162, a signal generating section 168, a driver unit 172, a measuring unit 174, a timing generating section 176, and a power supply section 178. The signal generating section 168 includes a waveform shaping section 170.

The pattern generating section 162 generates a logic pattern of a test signal. The pattern generating section 162 in the present example includes a pattern memory 164 and an expected value memory 166. The pattern generating section 162 may output the logic pattern pre-stored in the pattern memory 164. The pattern memory 164 may store the logic pattern supplied from the control apparatus 10 prior to starting of a test. The pattern generating section 162 may generate the logic pattern based on an algorithm supplied in advance.

The waveform shaping section 170 shapes the waveform of a test signal based on the logic pattern supplied from the pattern generating section 162. For example, the waveform shaping section 170 may shape the waveform of a test signal, by outputting the voltage corresponding to each logic value of the logic pattern for each predetermined bit period.

The driver unit 172 outputs a test signal corresponding to the waveform supplied from the waveform shaping section 170. For example, the driver unit 172 supplies a test signal to a semiconductor chip 310 via a connection pad 112 and a pad 119, in response to a timing signal generated by the timing generating section 176. For example, the driver unit 172 may supply a test signal to the operation circuit of the semiconductor chip 310 via the connection pad 112 and the pad 119. Exemplary test signals outputted from the driver unit 172 may include respective test signals for conducting a direct current test for judging whether the direct current power consumed by the semiconductor chip 310 satisfies a specification, a function test for judging whether the semiconductor chip 310 outputs a predetermined output signal in response to an input signal, and an analogue test for judging whether the characteristic of the signal outputted from the semiconductor chip 310 satisfies a specification.

The measuring unit 174 measures a response signal outputted from a semiconductor chip 310. For example, the measuring unit 174 measures the response signal outputted from the semiconductor chip 310 in response to the timing signal generated by the timing generating section 176, via a connection pad 112 and a pad 119. The measuring unit 174 judges pass/fail of the semiconductor chip 310 based on the response signal. For example, the logic comparing section 138 may judge pass/fail of the semiconductor chip 310, by comparing the expected value pattern supplied from the pattern generating section 162 with the logic pattern based on the response signal to see whether they match. For example, the logic comparing section 138 may judge pass/fail of the operation circuit of the semiconductor chip 310, by comparing the expected value pattern supplied from the pattern generating section 162 with the logic pattern based on the response signal to see whether they match.

The pattern generating section 162 may supply, to the measuring unit 174, the expected value pattern pre-stored in the expected value memory 166. The expected value memory 166 may store the expected value pattern supplied from the control apparatus 10 prior to starting of a test. The pattern generating section 162 may generate the expected value pattern based on an algorithm supplied in advance.

The writing circuit 182 writes pass/fail judgment result data generated by the measuring unit 174 concerning a semiconductor chip 310, to an embedded memory of the semiconductor chip 310. For example, the writing circuit 182 writes the pass/fail judgment result data of the operation circuit of the semiconductor chip 310 to the embedded memory of the semiconductor chip 310, via the connection pad 112 and the pad 119. Note that embedded memories of the plurality of semiconductor chips 310 formed on the semiconductor wafer 301 may respectively include the same address space as each other. The writing circuit 182 may write pass/fail judgment result data to the same predetermined address in the respective embedded memories.

In this way, the test circuit 160 judges pass/fail of the operation circuit of a semiconductor chip 310, based on the measurement result of measuring the electric characteristic of the signal outputted from the semiconductor chip 310. The writing circuit 182 writes the pass/fail judgment result data of the operation circuit to the embedded memory.

The reading circuit 184 reads the pass/fail judgment result data of a semiconductor chip 310, from the embedded memory included in the semiconductor chip 310. For example, the reading circuit 184 reads the data pre-stored in the predetermined address in the corresponding embedded memories. The pattern generating section 162 may output the logic pattern corresponding to the pass/fail judgment result data that the reading circuit 184 has read. Accordingly, the signal generating section 168 generates a test signal corresponding to the pass/fail judgment result data that the reading circuit 184 has read. In this way, the test circuit 160 can output, to the semiconductor chip 310, the test signal corresponding to the pass/fail judgment result data that the reading circuit 184 has read.

For example, when the pass/fail judgment result data that the reading circuit 184 has read from an embedded memory indicates "fail," the test circuit 160 may provide the semiconductor chip 310 including the embedded memory with a different test signal that is to be provided on condition that the pass/fail judgment result data indicates "fail." For example, the test circuit 160 may output, as the different test signal, a test signal for conducting a test whose condition is more lenient than the test from which the pass/fail judgment result data indicates "fail."

For example, when the pass/fail judgment result data indicating "fail" results from a test concerning a high frequency operation of a semiconductor chip 310, an example of the different test signal may be a test signal for testing a low frequency operation of the semiconductor chip 310. Note that when the pass/fail judgment result data that the reading circuit 184 has read from an embedded memory indicates "fail," the test circuit 160 may refrain from outputting any further different test signal to the semiconductor chip 310 having the embedded memory.

The driving circuit 180 controls electrical connection of the embedded memories of the semiconductor chips 310, to the writing circuit 182 and the reading circuit 184. For example, the driving circuit 180 selects an embedded memory to which the writing circuit 182 writes the pass/fail judgment result data, from among the embedded memories of the corresponding two or more semiconductor chips 310, and electrically connects the selected embedded memory to the writing circuit 182. Moreover, the driving circuit 180 selects an embedded memory from which the reading circuit 184 reads the pass/fail judgment result data, from among the embedded memories of the corresponding two or more semiconductor chips 310, and electrically connects the selected embedded memory to the reading circuit 184.

The power supply section 178 supplies a power-supply power to a semiconductor chip 310. For example, the power supply section 178 may supply, to the semiconductor chip 310, the power-source power corresponding to the power supplied from the control apparatus 10 during a test. The power supply section 178 may also supply a driving power to a circuit realizing each functional configuration of the test circuit 160.

The test circuit unit 118 having the explained configuration helps realize a test system 400 having a small sized control apparatus 10. For example, an exemplary control apparatus 10 is a general-purpose personal computer.

As explained above, the test wafer 111 is provided with a plurality of test circuits 160, a plurality of writing circuits 182, and a plurality of reading circuits 184, in correspondence with the plurality of semiconductor chips 310. Each of the plurality of test circuits 160 supplies a test signal to the operation circuit of a corresponding one of the plurality of semiconductor chips 310. A test circuit 160 measures the electric characteristic of the signal outputted from the operation circuit in response to the test signal. Each of the plurality of writing circuits 182 writes the data corresponding to the measurement result in a corresponding one of the test circuits 160, to the corresponding embedded memory.

In addition, each of the plurality of reading circuits 184 reads the data pre-stored in the predetermined address of the corresponding embedded memory. A test circuit 160 supplies a test signal corresponding to the data read from the corresponding reading circuit 184 to the corresponding operation circuit.

The test system 400 may sequentially electrically connect a plurality of test wafers 111 to the semiconductor wafer 301. For example, the test system 400 may sequentially electrically connect, to the semiconductor wafer 301, the plurality of test wafers 111 for performing respectively different types of tests. The control apparatus 10 may control each writing circuit 182 of a first test wafer 111 to write the measurement result to the predetermined designated address of the embedded memory. The control apparatus 10 may control each reading circuit 184 of a second test wafer 111 to read the measurement result from the predetermined designated address of the embedded memory. During this process, the control apparatus 10 may control the operation circuit of the semiconductor chip 310 to output, to the test circuit 160, a test signal corresponding to the measurement result.

Figure 5:
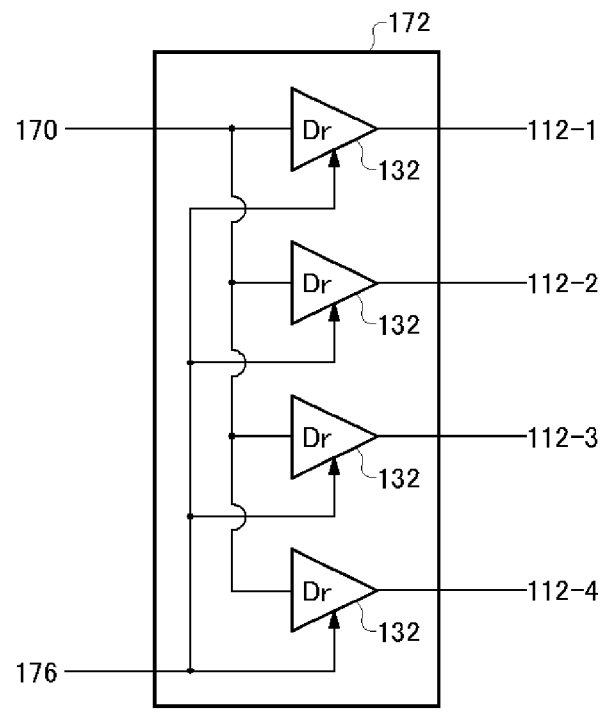
FIG. 5 is a block diagram showing an exemplary functional configuration of a driver unit 172 and a measuring unit 174.
Figure 5:
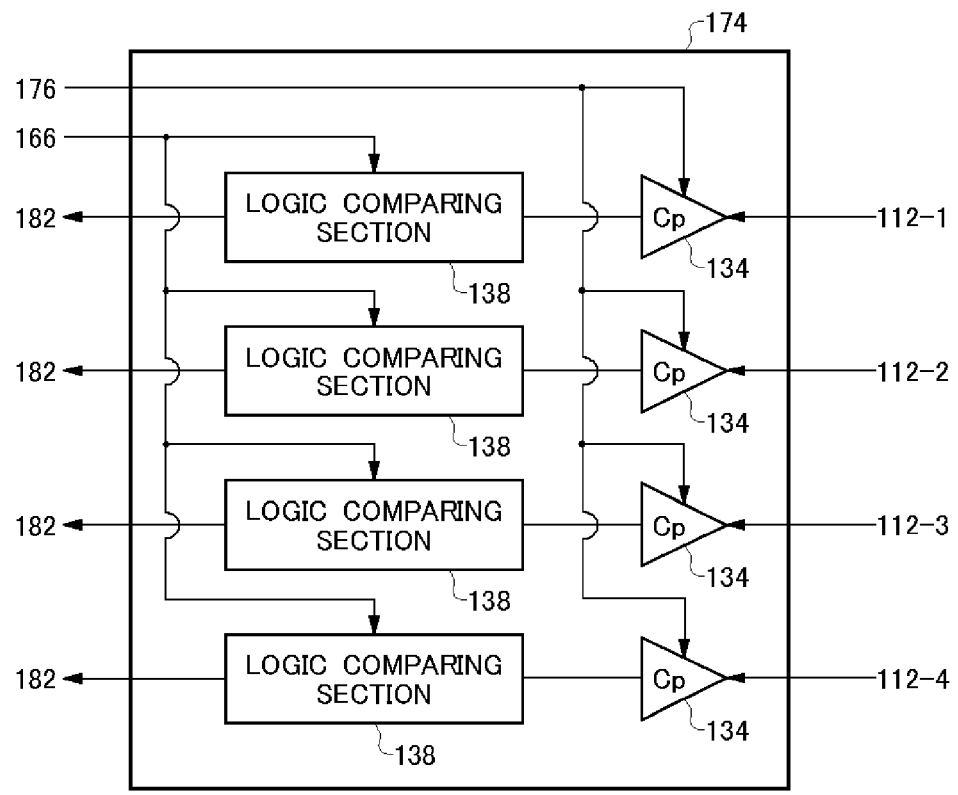

FIG. 5 is a block diagram showing an exemplary functional configuration of a driver unit 172 and a measuring unit 174. The driver unit 172 includes a plurality of drivers 132. The measuring unit 174 includes a plurality of comparators 134 and a plurality of logic comparing sections 138.

Each of the plurality of drivers 132 outputs a test signal to each semiconductor chip 310 corresponding to the circuit block 110. The plurality of drivers 132 may be provided in one to one relation with the corresponding semiconductor chips 310. Note that each of the plurality of drivers 132 is connected to a corresponding semiconductor chip 310 via a pad 119 and a connection pad 112. The test signal outputted from the driver 132 is supplied to the semiconductor chip 310 via the pad 119 and the connection pad 112.

A driver 132 outputs a test signal corresponding to the waveform supplied from the waveform shaping section 170 to a corresponding semiconductor chip 310. For example, a driver 132 may output a test signal in response to the timing signal supplied from the timing generating section 176. For example, a driver 132 may output a test signal having the same period as that of the timing signal.

The plurality of comparators 134 measure the response signals outputted from the semiconductor chips 310 corresponding to the circuit blocks 110. The plurality of comparators 134 may be provided in one to one relation with the semiconductor chips 310. Note that each of the plurality of comparators 134 is connected to a corresponding semiconductor chip 310 via a pad 119 and a connection pad 112. The response signal from the corresponding semiconductor chip 310 is supplied to the comparator 134 via the connection pad 112 and the pad 119. Note that a comparator 134 may measure the logic pattern of a response signal by sequentially detecting the logic value of the response signal according to the strobe signal supplied from the timing generating section 176.

The plurality of logic comparing sections 138 judge pass/fail of the semiconductor chips 310 corresponding to the circuit block 110, based on the logic pattern of the response signal measured by the plurality of comparators 134. The plurality of logic comparing sections 138 may be provided in one to one relation with the semiconductor chips 310 corresponding to the circuit block 110. Each of the plurality of logic comparing sections 138 determines pass/fail of a corresponding semiconductor chip 310 based on the logic pattern of the response signal of the corresponding semiconductor chip 310 measured by the corresponding comparator 134. For example, each logic comparing section 138 may determine pass/fail of a semiconductor chip 310 by comparing the expected value pattern supplied from the pattern generating section 162 to the logic pattern detected by the comparator 134 to see whether they match. The comparison result of the logic comparing section 138 is supplied to the writing circuit 182, and written to the embedded memory of the corresponding semiconductor chip 310.

As explained above, the driver unit 172 may receive, in parallel, the test signals generated by the signal generating section 168, and supply signals corresponding to the test signals, to the plurality of semiconductor chips 310 substantially simultaneously. In this way, each test circuit 160 may generate a common test signal to two or more semiconductor chips 310 to be tested, and supplies the test signal to the two or more semiconductor chips 310 via a connection pad 112 substantially simultaneously. The measuring unit 174 may then obtain the response signals from the plurality of semiconductor chips 310 substantially simultaneously, and judge pass/fail of the semiconductor chips 310. Consequently, the test circuit 160 can substantially simultaneously test the corresponding plurality of semiconductor chips 310.

Note that one comparator 134 and the logic comparing section 138 for judging pass/fail of the semiconductor chip 310 based on the response signal measured by the comparator 134 function as a measuring section for measuring the signal outputted from the semiconductor chip 310. Therefore, the driver unit 172 includes a plurality of measuring sections, each measuring section corresponding to each of the two or more semiconductor chips 310 to be tested, and measuring a signal outputted from a corresponding one of the two or more semiconductor chips 310.

Also as explained with reference to FIG. 4, the test circuit unit 118 may include a single signal generating section 168. That is, the signal generating section 168 is provided in common to two or more semiconductor chips 310 to be tested. On the other hand, each of the two or more semiconductor chips 310 is provided with one driver 132. The drivers 132 provided for the two or more semiconductor chips 310 receive the test signals generated by the signal generating section 168, in parallel, and supply the signal according to the received test signals to the test pads of the semiconductor chips 310 via the connection pads 112.

Since a plurality of drivers 132 are provided for two or more semiconductor chips 310 to be tested, the circuit block 110 of the test wafer 111 may be provided with a low-output driver 132. This helps reduce the size of the driver 132 to be implemented on the circuit block 110 of the test wafer 111, as well as easily implementing the plurality of drivers 132 on the circuit block 110.

Note that in the present configuration example, each semiconductor chip 310 is provided with a driver 132. However, it is also possible to provide a plurality of drivers 132 for each one semiconductor chip 310. For example, a plurality of drivers 132 may be provided to correspond to the test pads of a semiconductor chip 310.

Also as explained with reference to FIG. 4 and FIG. 5, when substantially simultaneously testing the two or more semiconductor chips 310, the pattern generating section 162, the signal generating section 168, the timing generating section 176, and the power supply section 178 may be provided in common to the two or more semiconductor chips 310 to be tested. In addition, the writing circuit 182, the reading circuit 184, and the driving circuit 180 may also be provided in common to the two or more semiconductor chips 310 to be tested. With this construction, the mounting area required for the test circuit 160, the writing circuit 182, the reading circuit 184, and the driving circuit 180 can be reduced, compared to a case where each of the semiconductor chips 310 is provided with a circuit realizing each function of a pattern generating section 162, a signal generating section 168, a timing generating section 176, and a power supply section 178.

Figure 6:
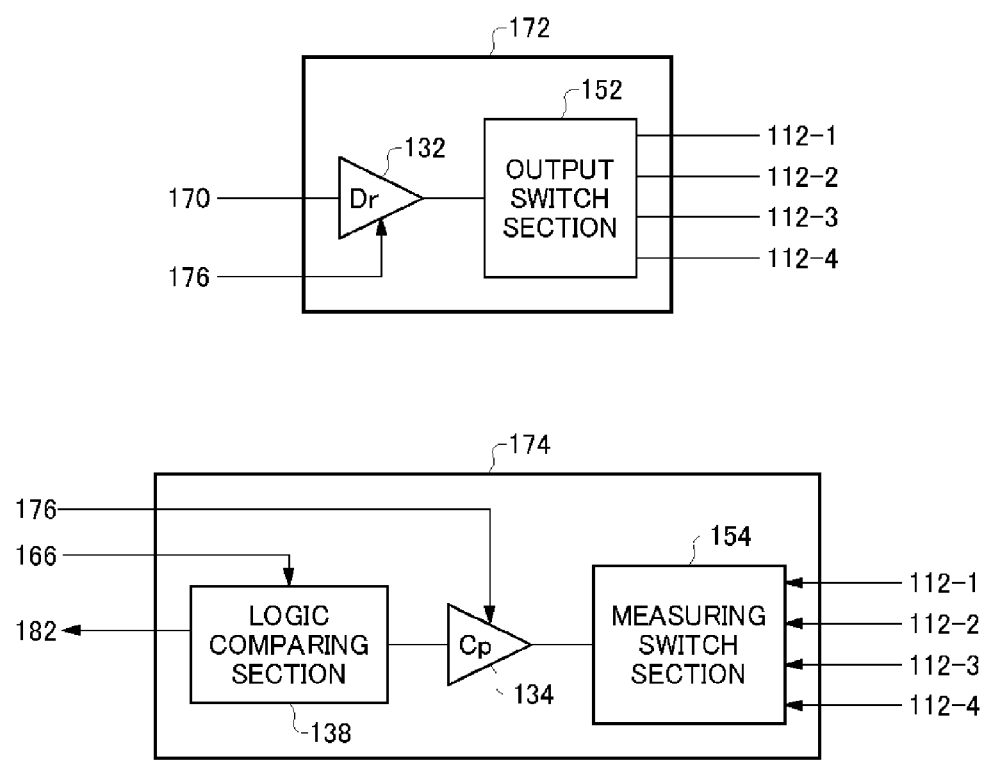
FIG. 6 is a block diagram showing another exemplary functional configuration of the driver unit 172 and the measuring unit 174.

FIG. 6 is a block diagram showing another exemplary functional configuration of the driver unit 172 and the measuring unit 174. The driver unit 172 includes a driver 132 and an output switch section 152. The measuring unit 174 includes a logic comparing section 138, a comparator 134, and a measuring switch section 154.

The operation of the driver 132 may be the same as the operation of the driver 132 explained with reference to FIG. 5, except that the driver 132 in the present example outputs a test signal to the output switch section 152. The output switch section 152 is connected to the semiconductor chips 310 corresponding to the circuit block 110, via the pad 119 and the connection pad 112. The output switch section 152 selects the semiconductor chip 310 to which the test signal from the driver 132 is outputted.

Concretely, the output switch section 152 selects one of the connection pads 112 each of which is electrically connected to a semiconductor chip 310, for supplying a test signal from the driver 132 to the selected connection pad 112. In this way, the output switch section 152 can switch among the connection pads 112 each of which is electrically connected to a test pad of a semiconductor chip 310, for supplying a signal outputted from the driver to the selected connection pad 112.

The measuring switch section 154 is connected to the semiconductor chips 310 corresponding to the circuit block 110, via the pad 119 and the connection pad 112. The measuring switch section 154 selects the semiconductor chip 310 to obtain a response signal. Concretely, the measuring switch section 154 selects one of the connection pads 112 each of which is electrically connected to a semiconductor chip 310, for connecting the comparator 134 to the selected connection pad 112. In this way, the measuring switch section 154 switches among the response signals each of which is outputted from a semiconductor chip 310, for supplying the selected response signal to the comparator 134.

Note that the output switch section 152 may sequentially switch the connection pads 112 each of which is electrically connected to a test pad of a semiconductor chip 310, for providing a signal outputted from the driver to the selected connection pad 112. Likewise, the measuring switch section 154 may sequentially switch among response signals each of which is outputted from a semiconductor chip 310, to supply the selected response signal to the comparator 134.

The operation of the comparator 134 may be the same as the operation of the comparator 134 explained with reference to FIG. 5, except that the comparator 134 in the present example obtains a response signal from the measuring switch section 154. In addition, the operation of the logic comparing section 138 may be the same as the operation of the comparator 134 explained with reference to FIG. 5. Note that one comparator 134 and the logic comparing section 138 for judging pass/fail of the semiconductor chip 310 based on the response signal measured by the comparator 134 function as a measuring section for measuring the signal outputted from the semiconductor chip 310. Therefore, one measuring unit 174 is provided in common to two or more semiconductor chips 310 to be tested, and includes a measuring section for sequentially measuring the signals outputted from the two or more semiconductor chips 310.

The circuit block 110 in the functional configuration of the present block diagram includes one driver 132, one output switch section 152, one logic comparing section 138, one comparator 134, and one measuring switch section 154, for the two or more semiconductor chips 310 corresponding to the circuit block 110. In a different configuration, a smaller number of drivers 132, output switch sections 152, logic comparing sections 138, comparators 134, and measuring switch sections 154 than the number of semiconductor chips 310 corresponding to the circuit block 110 may be provided in the circuit block 110.

In this way, the switch control performed by the output switch section 152 and the measuring switch section 154 enables the test circuit 160 to generate a common test signal to the two or more semiconductor chips 310 to be tested, and supply the test signals to the two or more semiconductor chips 310 via the connection pad 112 in sequence. In the present configuration example, the driver 132, the comparator 134, and the logic comparing section 138 can also be provided in common to the two or more semiconductor chips 310 to be tested, in addition to the functional configuration explained above with reference to FIG. 4 and FIG. 5. This helps further reduce the mounting area required for the test circuit 160, the writing circuit 182, the reading circuit 184, and the driving circuit 180.

Figure 7:
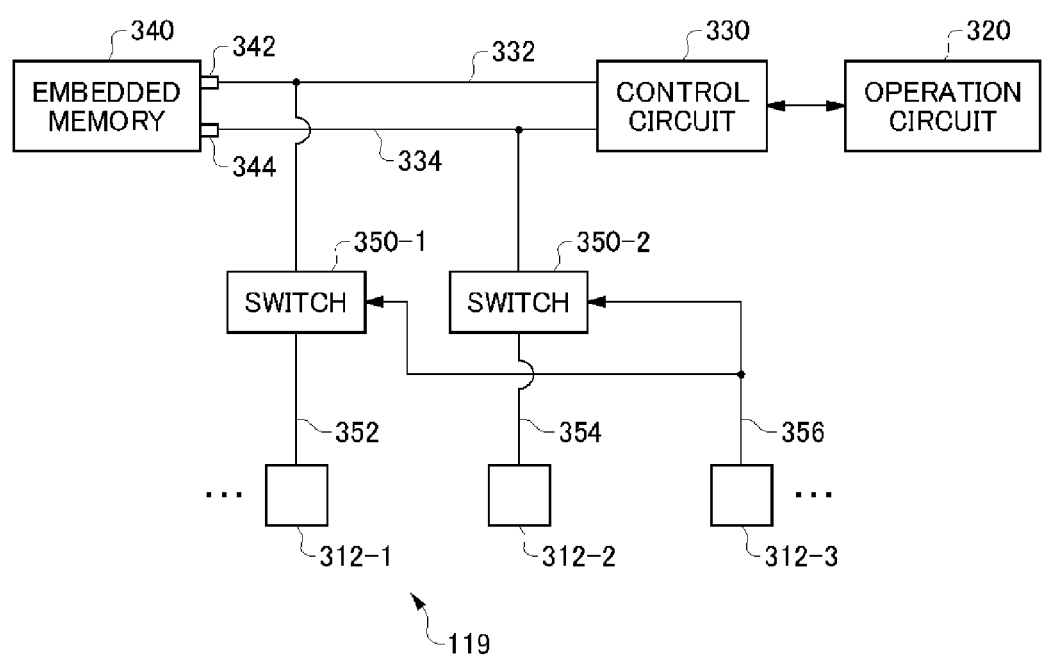
FIG. 7 is a block diagram showing an exemplary functional configuration of a semiconductor chip 310.

FIG. 7 is a block diagram showing an exemplary functional configuration of a semiconductor chip 310. The semiconductor chip 310 includes an operation circuit 320, a control circuit 330, an embedded memory 340, a data terminal 342, an address terminal 344, an internal data terminal wire 332, an internal address terminal wire 334, a switch 350, an external data terminal wire 352, an external address terminal wire 354, an external switch wire 356, and a plurality of test pads 312. The function of the semiconductor chip 310 is realized by the operation of the operation circuit 320. Moreover, the embedded memory 340 is used for the operation of the operation circuit 320.

During the operation of the semiconductor chip 310, the operation circuit 320 may write the data for the operation of the operation circuit 320 to the embedded memory 340. Also during the operation of the semiconductor chip 310, the operation circuit 320 may read the data from the embedded memory 340, and use the read data. The operation circuit 320 may delete the data from the embedded memory 340, during the operation of the semiconductor chip 310. Note that the operation circuit 320 may read data from or write data to the embedded memory 340 via the control circuit 330, during the operation of the semiconductor chip 310.

The control circuit 330 controls reading/writing of data directed to the embedded memory 340. The control circuit 330 is electrically connected to the data terminal 342 of the embedded memory 340 via the internal data terminal wire 332. The control circuit 330 is electrically connected to the address terminal 344 of the embedded memory 340 via the internal address terminal wire 334.

When writing data to the embedded memory 340, the control circuit 330 outputs an electric signal designating the memory address to write the data to, to the address terminal 344 via the internal address terminal wire 334. Also when writing data to the embedded memory 340, the control circuit 330 outputs an electric signal designating the data to be written, to the data terminal 342 via the internal data terminal wire 332. The embedded memory 340 stores the data indicated by the electric signal inputted to the data terminal 342, to the memory address indicated by the electric signal inputted to the address terminal 344.

When reading data form the embedded memory 340, the control circuit 330 outputs an electric signal designating the memory address from which data is read, to the address terminal 344 via the internal address terminal wire 334. The embedded memory 340 outputs, to the data terminal 342, an electric signal indicating the data stored in the memory address indicated by the electric signal inputted to the address terminal 344. The control circuit 330 reads the data from the embedded memory 340, by obtaining, via the internal data terminal wire 332, the electric signal outputted to the data terminal 342.

Note that the external data terminal wire 352 electrically connects the data terminal 342 to the test pad 312-1. The external address terminal wire 354 electrically connects the address terminal 344 to the test pad 312-2. The switch 350-1 is provided on the external data terminal wire 352, and controls the electrical connection between the test pads 312 and the data terminal 342. The switch 350-2 is provided on the external address terminal wire 354, and controls the electrical connection between the test pads 312 and the address terminal 344. Note that the test pad 312-1 and the test pad 312-2 function as an external memory access terminal connected to an external circuit. In addition, the test pad 312-1 and the test pad 312-2 may be larger than any of the data terminal 342 and the address terminal 344.

In this way, each semiconductor chip 310 includes a wire (e.g., external data terminal wire 352 and external address terminal wire 354) to electrically connect the data terminal 342 and the address terminal 344 in the embedded memory 340, to the test pad 312-1 and the test pad 312-2 provided in the semiconductor chip 310, respectively. Each semiconductor chip 310 includes a switch 350 to control electrical connection of the data terminal 342 and the address terminal 344 of the corresponding embedded memory 340 to the test pads 312.

Moreover, the external switch wire 356 electrically connects the test pad 312-3 to the switch 350. The switch 350 operates according to an electric signal inputted from the test pad 312-3 via the external switch wire 356. Specifically, when a predetermined electric signal is inputted from the test pad 312-3 via the external switch wire 356, the switch 350-1 performs a close operation, to electrically connect the data terminal 342 and the test pad 312-1 connected to the external data terminal wire 352. Likewise, on condition that a predetermined electric signal is inputted from the test pad 312-3 via the external switch wire 356, the switch 350-2 performs a close operation, to electrically connect the address terminal 344 and the test pad 312-2 connected to the external address terminal wire 354.

Note that the switch 350-1 and the switch 350-2 may perform the close operation when a voltage of a predetermined value or more is inputted. The switch 350-1 and the switch 350-2 may be in the open state when no electric signal is given from outside to the test pad 312-3 connected to the external switch wire 356.

The driving circuit 180 outputs an electric signal to the test pad 312-3 via the connection pad 112 and the pad 119 connected to the test pad 312-3. For example, when the writing circuit 182 and the reading circuit 184 write data to and read data from the embedded memory 340 via the test pad 312-1 and the test pad 312-2, the driving circuit 180 outputs a predetermined electric signal to the test pad 312-3, to control the switch 350 of the corresponding semiconductor chip 310 to electrically connect the data terminal 342 and the address terminal 344 to the test pads 312-1 through 312-2. For example, when the writing circuit 182 and the reading circuit 184 write data to and read data from the embedded memory 340 via the test pad 312-1 and the test pad 312-2, the driving circuit 180 may outputs a voltage having a predetermined value or more, to the test pad 312-3.

The writing circuit 182 and the reading circuit 184 read data from or write data to the embedded memory 340 via the test pad 312-1 and the test pad 312-2. Specifically, the writing circuit 182 and the reading circuit 184 write data to or read data from the embedded memory 340 via the test pad 312-1 and the test pad 312-2, while the data terminal 342 and the address terminal 344 are in electrical connection with the test pad 312 by means of the switch 350 under control by the driving circuit 180.

As described above, each semiconductor chip 310 includes a control circuit 330 for controlling the reading/writing of data with respect to the corresponding embedded memory 340. Note that the writing circuit 182 and the reading circuit 184 may write data to and read data from the embedded memory 340 via the control circuit 330. For example, the control circuit 330 may be electrically connected to the test pad 312. The writing circuit 182 and the reading circuit 184 may output, to the pad 119 and the connection pad 112 electrically connected to the test pad 312, an electric signal for instructing the control circuit 330 to write data to and read data from the embedded memory 340.

Note that the semiconductor chip 310 can also control the switch 350, instead of control of the switch 350 by the driving circuit 180. For example, when supplied with an instruction to cause the semiconductor chip 310 to be ready for a test, the semiconductor chip 310 may close the switch 350.

For example, the semiconductor chip 310 may include a register to set the state of the semiconductor chip 310. Here, the state of the semiconductor chip 310 includes a state (a ready state for a test) in which the semiconductor chip 310 is ready for a test conducted by the test system 400. When the register is supplied with an electric signal for setting the semiconductor chip 310 to the ready state for a test, the semiconductor chip 310 may close the switch 350. Accordingly, the test pad 312-1 and the data terminal 342 are brought in electrical connection, and the test pad 312-2 and the address terminal 344 are brought in electrical connection.

When the register is not supplied with any electric signal for setting the semiconductor chip 310 to a ready state for a test, the semiconductor chip 310 may open the switch 350. Accordingly, no electrical connection is provided between the test pad 312-1 and the data terminal 342, and between the test pad 312-2 and the address terminal 344.

When testing a semiconductor chip 310, the driving circuit 180 may output an electric signal for setting the semiconductor chip 310 to the ready state for a test, to the register of the semiconductor chip 310, thereby setting the semiconductor chip 310 to the ready state for a test. Note that the driving circuit 180 may obtain, from the control apparatus 10, register information to be outputted for setting the semiconductor chip 310 to the ready sate for a test.

Note that the embedded memory 340 may be a semiconductor memory formed by a semiconductor device. The embedded memory 340 may be a volatile memory. An example of the embedded memory 340 is a volatile random access memory.

The writing circuit 182 and the reading circuit 184 may obtain, from the control apparatus 10, control information for reading data from and writing data to the embedded memory 340. The writing circuit 182 and the reading circuit 184 may write data to and read data from the embedded memory 340, based on the control information obtained from the control apparatus 10. Exemplary control information includes an output method for outputting the memory address to the address terminal 344, the specification of the write data to be outputted to the address terminal 344, and the specification of the read data outputted to the address terminal 344. When data is read from or written to the embedded memory 340 via the control circuit 330, exemplary control information may include the control specification of the control circuit 330.

Figure 8:
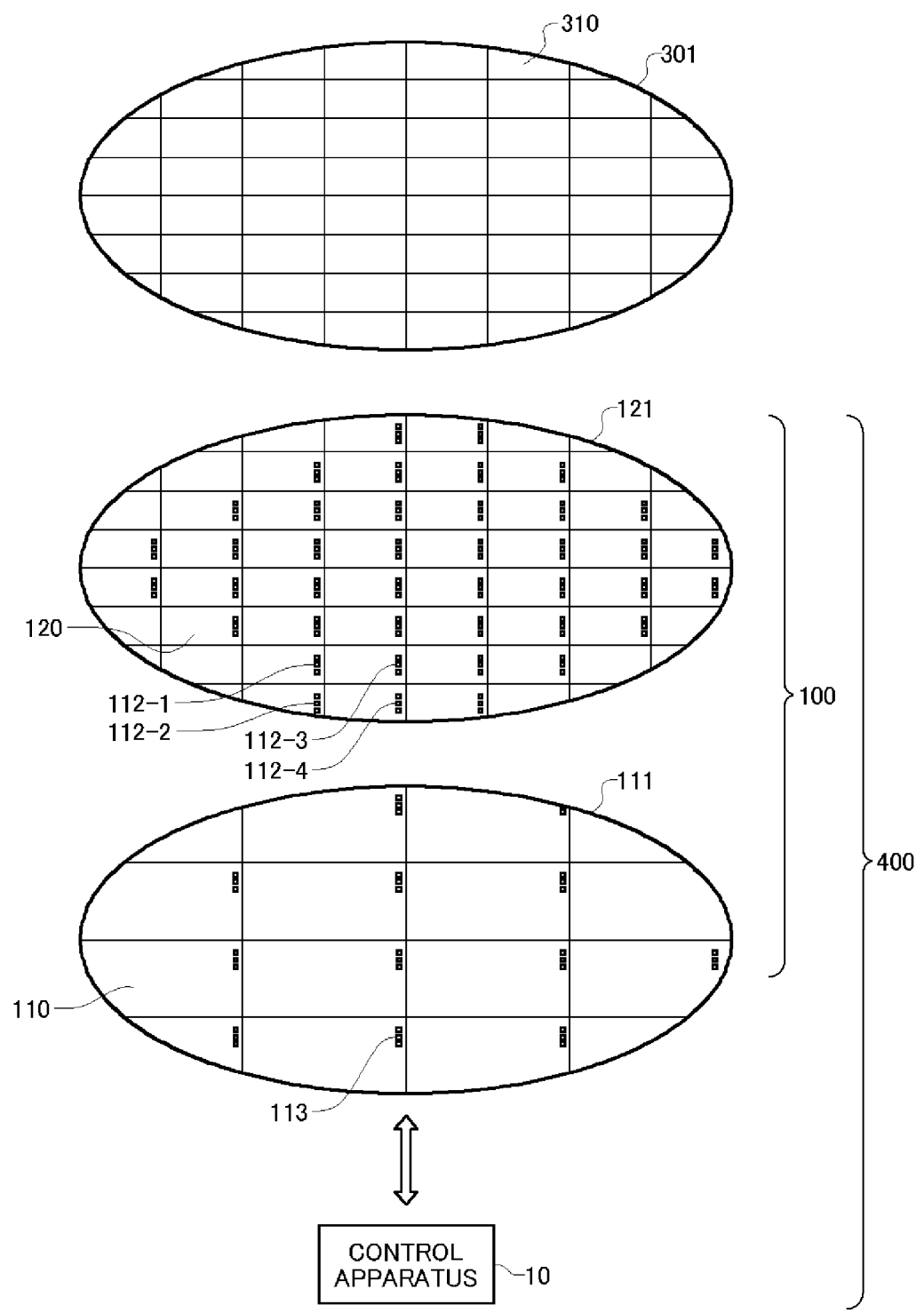
FIG. 8 shows another exemplary configuration of the test wafer unit 100.

FIG. 8 shows another exemplary configuration of the test wafer unit 100. The test wafer unit 100 in the present example includes a test wafer 111 and a connection wafer 121. The test wafer 111 in the present configuration example is the same as the test wafer 111 explained with reference to FIG. 1 through FIG. 7, except that the test wafer 111 in the present configuration example includes a smaller number of intermediate pads 113 than the connection pads 112 explained with reference to FIG. 1 through FIG. 7. The following explanation focuses on the difference of the test wafer 111 in the present configuration example from the test wafer 111 explained with reference to FIG. 1 through FIG. 7, and refrains from detailing each constituting element.

The connection wafer 121 is provided between the test wafer 111 and the semiconductor wafer 301, and electrically connects the test wafer 111 to the semiconductor wafer 301. The connection wafer 121 includes a plurality of circuit blocks 120 corresponding to the plurality of semiconductor chips 310. The plurality of circuit blocks 120 of the connection wafer 121 are provided in one to one relation with the plurality of semiconductor chips 310 of the semiconductor wafer 301. A semiconductor chip 310 and a circuit block 120 corresponding to each other are electrically connected to each other. The connection wafer 121 electrically connects the circuit blocks 110 on the test wafer 111 to the semiconductor chips 310 on the semiconductor wafer 301.

Both of the test wafer 111 and the connection wafer 121 may be made of the same semiconductor material as the semiconductor material used to make the semiconductor wafer 301, and have a shape corresponding to the shape of the semiconductor wafer 301. As already explained with reference to FIG. 1, "a corresponding shape" or similar expressions indicates that the relevant members have the same shape as each other, or that the relevant members are shaped such that one corresponds to a part of the other. The test wafer 111 may have substantially the same shape as the connection wafer 121.

In the present exemplary configuration, the plurality of circuit blocks 110 are provided so that each one circuit block 110 corresponds to two or more semiconductor chips 310 and two or more circuit blocks 120. Hereinafter, two or more circuit blocks 120 provided to correspond to each of the plurality of circuit blocks 110 may be occasionally simply referred to as "corresponding circuit block(s) 120."

Each circuit block 120 may be provided to correspond, in position, to the corresponding semiconductor chips 310, when the connection wafer 121 is overlapped on the semiconductor wafer 301. Each circuit block 110 may correspond, in position, to overlap the region in which the corresponding circuit blocks 120 are formed when the test wafer 111 is overlapped on the connection wafer 121.

Each circuit block 110 is brought in electrical connection to the corresponding circuit blocks 120 by overlapping the test wafer 111 on the connection wafer 121, and supplies an electric signal to the circuit blocks 120. Each circuit block 120 is brought in electrical connection with the corresponding semiconductor chips 310, when the test wafer 111 and the connection wafer 121 are overlapped on the semiconductor wafer 301, and supplies the test signal received from the corresponding circuit blocks 110 to the corresponding semiconductor chip 310.

Note that the connection wafer 121 may be electrically connected to the test wafer 111 via an anisotropic conductive sheet. The connection wafer 121 may also be electrically connected to the semiconductor wafer 301 via an anisotropic conductive sheet and a bump-including membrane sheet. The control apparatus 10 may control each test circuit unit 118 in each circuit block 110, just as the control apparatus 10 explained above with reference to FIG. 1 through FIG. 7.

Figure 9:
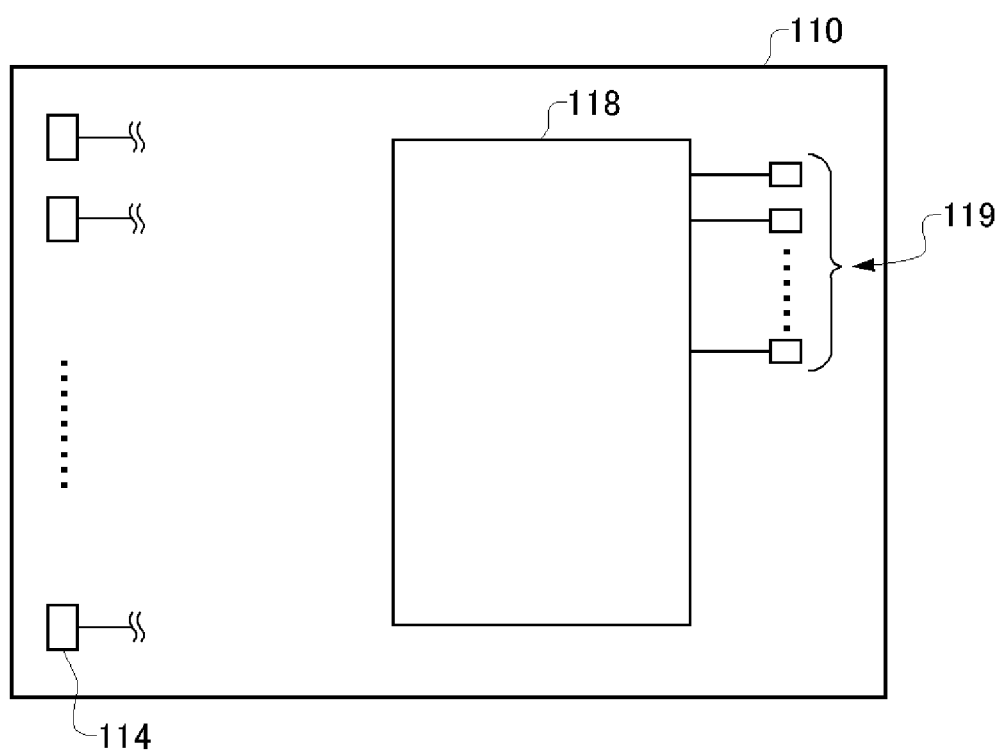
FIG. 9 shows an exemplary configuration of a circuit block 110 in a test wafer 111.

FIG. 9 shows an exemplary configuration of a circuit block 110 in a test wafer 111. The circuit block 110 is different in configuration from the circuit block 110 explained with reference to FIG. 3, in that the present circuit block 110 includes a smaller number of pads 119 than in the case of FIG. 3. For example, the number of pads 119 of the circuit block 110 is equal to the number of the test pads 312 included in a part of the semiconductor chips 310 corresponding to the circuit block 110. For example, the circuit block 110 includes the pads 119 equal in number to the test pads 312 of a single semiconductor chip 310.

Each pad 119 is electrically connected to the connection wafer 121. Note that the pads 119 and the test circuit units 118 may be provided on a surface of the test wafer 111 which faces the connection wafer 121, or on the rear surface opposite to the surface. When the pads 119 are provided on the rear surface, each pad 119 may be electrically connected to the connection wafer 121 via a through hole 116 as already explained with reference to FIG. 2. For example, each pad 119 may be electrically connected to an intermediate pad 113 that is in electrical connection with the connection wafer 121, via such a through hole 116 as explained with reference to FIG. 2.

The other configurations of the present circuit block 110 may be the same as the corresponding configurations of the circuit block 110 explained above with reference to FIG. 3. In addition, the present test circuit unit 118 may have the same functional configuration as the functional configuration of the test circuit unit 118 explained above with reference to FIG. 4.

Figure 10:
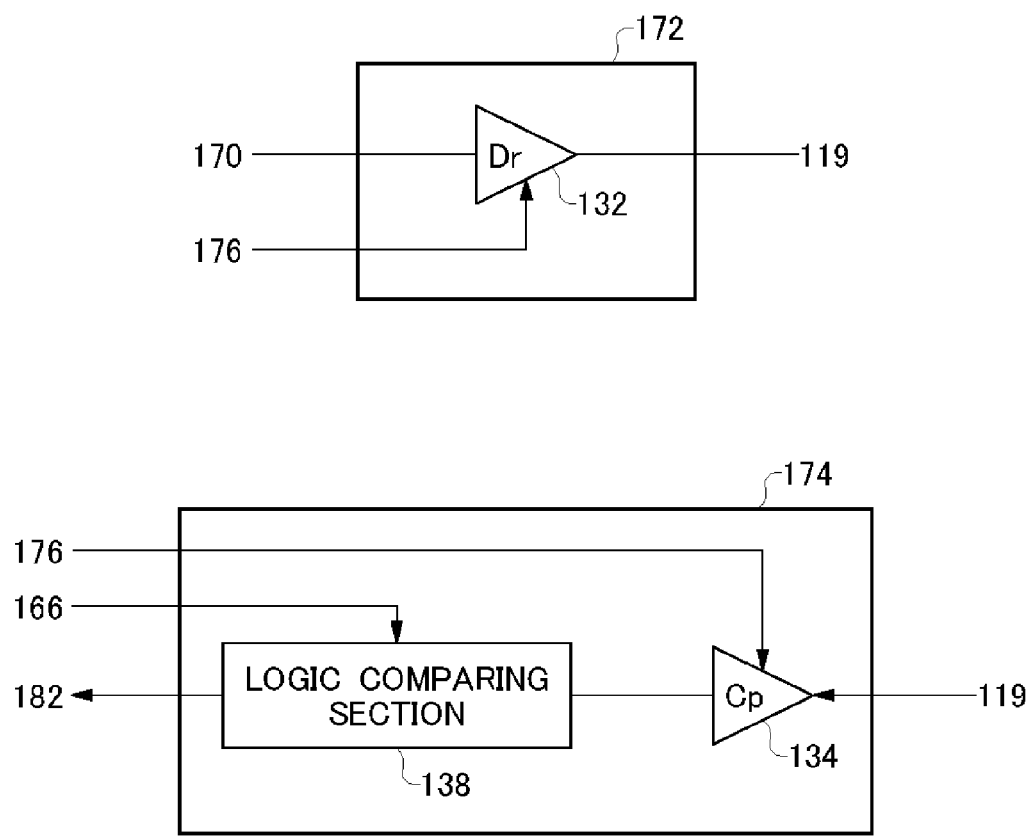
FIG. 10 shows an exemplary functional configuration of the driver unit 172 and the measuring unit 174.

FIG. 10 shows an exemplary functional configuration of the driver unit 172 and the measuring unit 174. The present configuration is different from the configuration of the driver unit 172 and the measuring unit 174 explained above with reference to FIG. 6 in that the present configuration does not have an output switch unit 152 or a measuring switch unit 154.

The driver 132 in the present configuration is electrically connected to a pad 119, and outputs a test signal to the pad 119. The comparator 134 is electrically connected to a pad 119, and obtains a response signal from a semiconductor chip 310 via the pad 119. The function and the operation of the logic comparing section 138, the function and the operation of the driver 132 except the immediately explained points, as well as the function and the operation of the comparator 134 except the immediately explained points are respectively the same as the function and the operation of the corresponding components explained with reference to FIG. 6. Therefore, the explanation thereof is omitted in the following.

Figure 11:
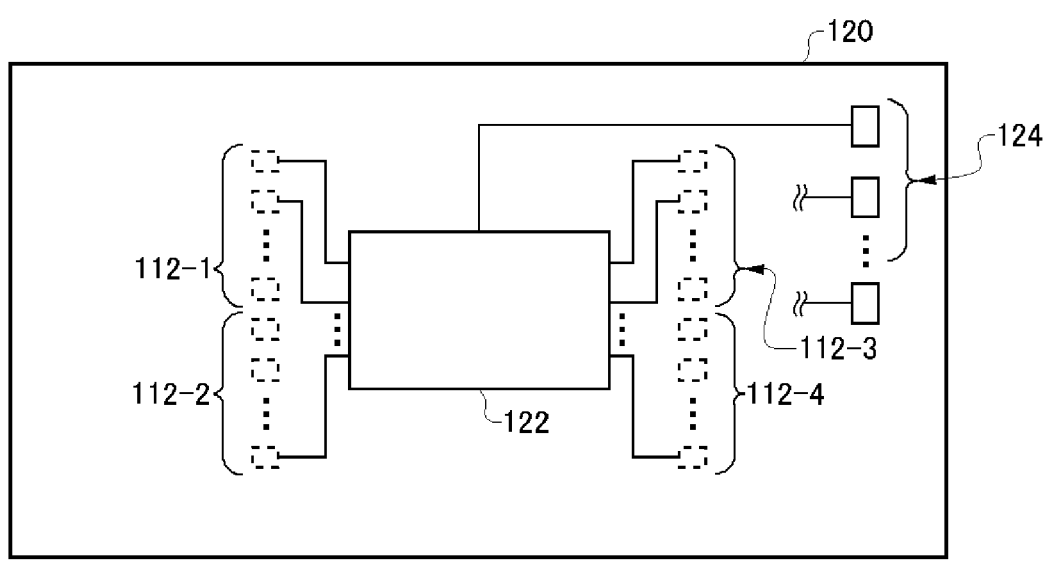
FIG. 11 shows an exemplary configuration of a circuit block 120.

FIG. 11 shows an exemplary configuration of a circuit block 120 on the connection wafer 121. The circuit block 120 includes an input/output switch section 122, intermediate pads 124, and a plurality of connection pads 112.

The input/output switch section 122 and the intermediate pads 124 may be provided on a surface of the connection wafer 121 which faces the test wafer 111. In addition, the rear surface of the connection wafer 121 which opposes the surface on which the input/output switch section 122 and the intermediate pads 124 are provided (in other words, the surface of the connection wafer 121 facing the semiconductor wafer 301) may be provided with a plurality of connection pads 112 to be in electrical connection with semiconductor chips 310. The plurality of intermediate pads 124 are respectively electrically connected to the pads 119 of the circuit blocks 110 via intermediate pads 113.

The input/output switch section 122 selects, for each intermediate pad 124, the connection pad 112 to be electrically connected thereto. For example, the input/output switch section 122 may include a switch for switching the connection relation between the plurality of intermediate pads 124 and the plurality of connection pads 112. A circuit block 110 may include an input/output switch section 122 for each intermediate pad 124.

Figure 12:
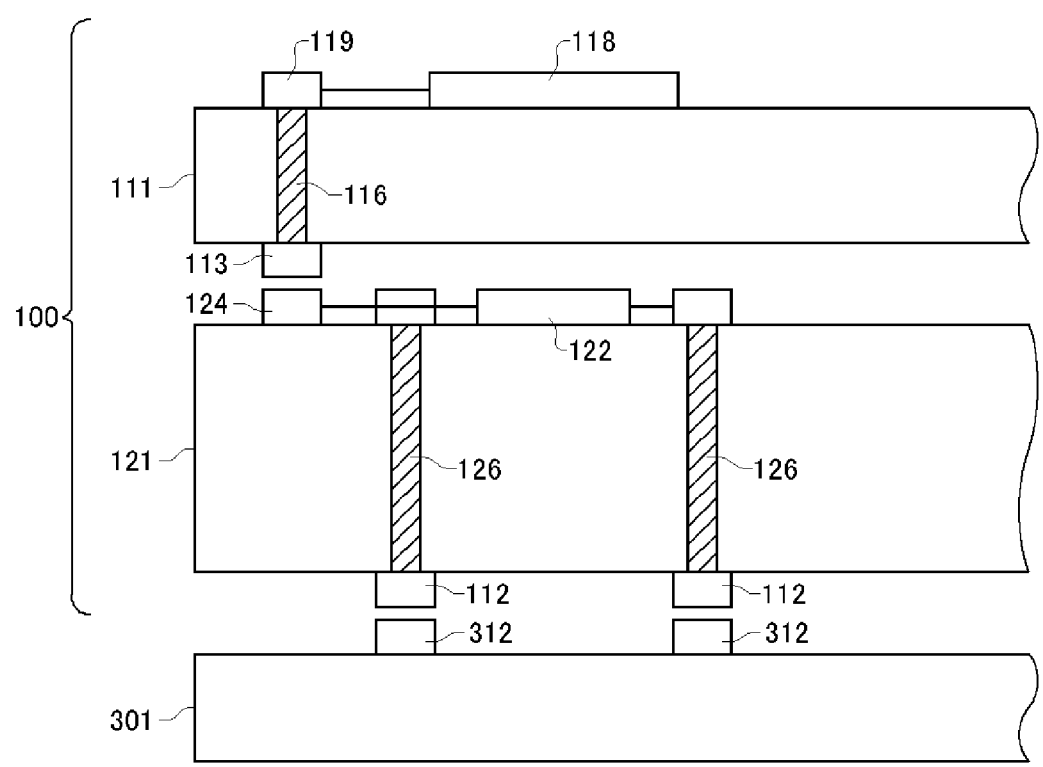
FIG. 12 shows a connection relation among the test wafer 111, a connection wafer 121, and a semiconductor wafer 301.

FIG. 12 shows a connection relation among the test wafer 111, the connection wafer 121, and the semiconductor wafer 301. FIG. 12 shows a partial cross section of the test wafer 111, the connection wafer 121, and the semiconductor wafer 301.

A plurality of test circuit units 118 are formed on a surface of the test wafer 111. Via a pad 119, a through hole 116, and an intermediate pad 113, each test circuit unit 118 is electrically connected to an intermediate pad 124 of the connection wafer 121 provided to face the rear surface of the test wafer 111.

An input/output switch section 122 is provided on a surface of the connection wafer 121 which faces the test wafer 111. The input/output switch section 122 is electrically connected to a pad 119 of the test wafer 111 via an intermediate pad 124 provided on a surface of the connection wafer 121.

The input/output switch section 122 is also electrically connected to a connection pad 112 provided on the rear surface of the connection wafer 121 which faces the semiconductor wafer 301. The input/output switch section 122 may be electrically connected to the connection pad 112 via a through hole 126 formed through the connection wafer 121. Here, the input/output switch section 122 selects the connection pad 112 to be connected to the intermediate pad 124.

The plurality of connection pads 112 are provided in one to one relation with the test pads 312 of the plurality of semiconductor chips 310, so that each connection pad 112 is electrically connected to a corresponding one of the test pads. For example, the distance between any two adjacent connection pads 112 may be the same as the distance between any two adjacent test pads 312 on the semiconductor wafer 301. Since the intermediate pads 124 are provided so that the pad distance therebetween is the same as the pad distance between the pads 119 on the test wafer 111, the pad distance of the intermediate pads 124 may be different from the pad distance of the connection pads 112.

In this way, the input/output switch section 122 can select the test pads 312 to be electrically connected to the pads 119, respectively. For example, the input/output switch section 122 may sequentially switch the connection pads 112 each of which is electrically connected to a test pad 312 of a semiconductor chip 310, for supplying a signal outputted from the driver 132 to the selected connection pad 112. In addition, the input/output switch 122 may sequentially switch the semiconductor chips 310, so as to supply the signal from the selected semiconductor chip 310 to a pad 119 of the comparator 134. In this way, the connection wafer 121 can supply the test signal generated by each test circuit 160 to the two or more semiconductor chips 310 to be tested by the test circuit 160.

The connection wafer 121 may be thicker than the test wafer 111. That is, the test wafer 111 may be comparatively thin. A thin test wafer 111 helps reduce the time required for forming the through holes 116 therethrough, as well as reducing the damage incurred on the test circuit units 118 in formation of the through holes 116. Also by fixing the test wafer 111 to a comparatively thick connection wafer 121, the strength of the test wafer units 100 can improve.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As clear from the above description, the embodiment(s) of the present invention realizes a test wafer unit and a test system for testing a plurality of semiconductor chips formed on a semiconductor wafer.

What is claimed is:

1. A test wafer unit for testing a plurality of semiconductor chips formed on a semiconductor wafer, the test wafer unit comprising:

a test wafer having a shape corresponding to a shape of the semiconductor wafer;

a plurality of test circuits formed on the test wafer, each test circuit provided to correspond to two or more of the plurality of semiconductor chips and testing the two or more semiconductor chips; and a plurality of connection terminals formed on the test wafer in one to one relation with test terminals of the plurality of semiconductor chips, each of the plurality of connection terminals being connected to a corresponding one of the test terminals, wherein each of the plurality of test circuits generates a common test signal to the two or more semiconductor chips to be tested, and substantially simultaneously supplies the test signal to the two or more semiconductor chips via connection terminals, among the plurality of connection terminals, which correspond to the two or more semiconductor chips, each of the plurality of test circuits including:

a signal generating section that is provided in common to the two or more semiconductor chips to be tested, and generates the test signal;

a plurality of drivers, each driver corresponding to one of the two or more semiconductor chips to be tested, receiving the test signal generated by the signal generating section in parallel, and supplying a signal corresponding to the test signal to the test terminal of a corresponding one of the two or more semiconductor chips via the connection terminal; and a timing generating section that supplies a timing signal to the plurality of drivers, and each driver outputs the signal corresponding to the test signal, in response to the timing signal.

2. The test wafer unit according to claim 1, wherein
each of the plurality of test circuits further includes a plurality of measuring sections, each measuring section corresponding to one of the two or more semiconductor chips to be tested, and measuring a signal outputted from a corresponding one of the two or more semiconductor chips.

3. The test wafer unit according to claim 1, comprising:
a connection wafer that has a shape corresponding to the shape of the semiconductor wafer, and supplies a test signal generated by each one of the plurality of test circuits to the two or more semiconductor chips to be tested by the test circuit; and
a plurality of connection terminals formed on the connection wafer in one to one relation with test terminals of the plurality of semiconductor chips, each connection terminal being connected to a corresponding one of the test terminals.

4. The test wafer unit according to claim 3, wherein
the connection wafer comprises:
    a plurality of intermediate terminals, each intermediate terminal being connected to a corresponding one connection terminal of the test wafer, the corresponding one connection terminal of the test wafer being connected to one of the plurality of test circuits; and
    an input/output switch section that is connected to each intermediate terminal and each connection terminal of the connection wafer and selects, for each intermediate terminal, one of the connection terminals of the connection wafer to be electrically connected thereto.

5. A test system for testing a plurality of semiconductor chips formed on a semiconductor wafer, the test system comprising:
a test wafer unit connected to the semiconductor wafer; and
a control apparatus that controls the test wafer unit, wherein
the test wafer unit includes:
a test wafer having a shape corresponding to a shape of the semiconductor wafer;
a plurality of test circuits formed on the test wafer, each test circuit provided to correspond to two or more of the plurality of semiconductor chips and testing the two or more semiconductor chips; and
a plurality of connection terminals formed on the test wafer in one to one relation with test terminals of the plurality of semiconductor chips, each of the plurality of connection terminals being connected to a corresponding one of the test terminals, wherein
each of the plurality of test circuits generates a common test signal to the two or more semiconductor chips to be tested, and substantially simultaneously supplies the test signal to the two or more semiconductor chips via connection terminals, among the plurality of connection terminals, which correspond to the two or more semiconductor chips, each of the plurality of test circuits including:
    a signal generating section that is provided in common to the two or more semiconductor chips to be tested, and generates the test signal;
    a plurality of drivers, each driver corresponding to one of the two or more semiconductor chips to be tested, receiving the test signal generated by the signal generating section in parallel, and supplying a signal corresponding to the test signal to the test terminal of a corresponding one of the two or more semiconductor chips via the connection terminal; and
    a timing generating section that supplies a timing signal to the plurality of drivers, and
each driver outputs the signal corresponding to the test signal, in response to the timing signal.

6. The test system according to claim 5, comprising:
a connection wafer that has a shape corresponding to the shape of the semiconductor wafer, and supplies a test signal generated by each one of the plurality of test circuits to the two or more semiconductor chips to be tested by the test circuit; and
a plurality of connection terminals formed on the connection wafer in one to one relation with test terminals of the plurality of semiconductor chips, each connection terminal being connected to a corresponding one of the test terminals.

7. The test system according to claim 6, wherein
the connection wafer comprises:
    a plurality of intermediate terminals, each intermediate terminal being connected to a corresponding one connection terminal of the test wafer; the corresponding one connection terminal of the test wafer being connected to one of the plurality of test circuits; and
    an input/output switch section that is connected to each intermediate terminal and each connection terminal of the connection wafer and selects, for each intermediate terminal, one of the connection terminals of the connection wafer to be electrically connected thereto.

\* \* \* \* \*